(12) United States Patent
Li et al.

(10) Patent No.: US 11,711,088 B2
(45) Date of Patent: Jul. 25, 2023

(54) ANALOG-TO-DIGITAL CONVERTER AND CLOCK GENERATION CIRCUIT THEREOF

(71) Applicant: CSMC TECHNOLOGIES FAB2 CO., LTD., Wuxi (CN)

(72) Inventors: Chen Li, Wuxi (CN); Hao Wang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 144 days.

(21) Appl. No.: 17/419,548

(22) PCT Filed: Dec. 23, 2019

(86) PCT No.: PCT/CN2019/127385
§ 371 (c)(1),
(2) Date: Jun. 29, 2021

(87) PCT Pub. No.: WO2020/140782
PCT Pub. Date: Jul. 9, 2020

(65) Prior Publication Data
US 2022/0077865 A1 Mar. 10, 2022

(30) Foreign Application Priority Data
Jan. 3, 2019 (CN) .......................... 201910003174.6

(51) Int. Cl.
*H03M 1/00* (2006.01)
*H03M 1/06* (2006.01)
(52) U.S. Cl.
CPC ......... *H03M 1/002* (2013.01); *H03M 1/0624* (2013.01)

(58) Field of Classification Search
CPC ...... H03M 1/002; H03M 1/0624; H03M 1/12; H03M 1/462; Y02D 10/00
(Continued)

(56) References Cited

U.S. PATENT DOCUMENTS 5,963,071 A * 10/1999 Dowlatabadi ...... H03K 5/00006
327/276
6,977,536 B2 * 12/2005 Chin-Chieh ......... H03K 5/1565
327/119

(Continued)

FOREIGN PATENT DOCUMENTS

| CN | 102427368 A | 4/2012 |
| CN | 103684465 A | 3/2014 |
| CN | 103986461 A | 8/2014 |

OTHER PUBLICATIONS

PCT International Search Report (w/ English translation) for corresponding PCT Application No. PCT/CN2019/127385, dated Mar. 23, 2020, 4 pages.

*Primary Examiner* — Khai M Nguyen
(74) *Attorney, Agent, or Firm* — Dority & Manning, P.A.

(57) ABSTRACT

An analog-to-digital converter and a clock generation circuit thereof are provided. The clock generation circuit comprises cascaded clock generation modules. The clock generation module at each stage is configured to generate a corresponding internal clock signal, and each stage of the clock generation module comprises a delay module and a logic gate module. The second input end of the N-th stage of the logic gate module is connected to the output end of the previous stage of the logic gate module, and the output end of the logic gate module is configured to output an internal clock, so that each stage of the clock generation module can generate one internal clock signal.

12 Claims, 3 Drawing Sheets

(58) Field of Classification Search
USPC .......................................................... 341/155
See application file for complete search history.

(56) References Cited

U.S. PATENT DOCUMENTS

| | | | |
|---|---|---|---|
| 9,973,178 B1* | 5/2018 | Holzmann | H03K 5/00006 |
| 10,312,932 B2* | 6/2019 | Nakamura | H03M 1/462 |
| 2010/0090876 A1 | 4/2010 | Taft et al. | |
| 2012/0068747 A1 | 3/2012 | Wan | |

* cited by examiner

US 11,711,088 B2

ANALOG-TO-DIGITAL CONVERTER AND CLOCK GENERATION CIRCUIT THEREOF

CROSS-REFERENCE TO RELATED APPLICATION

The present application is a national phase entry of International Application No. PCT/CN2019/127385, filed Dec. 23, 2019, which, in turn, claims priority to Chinese patent application No. 2019100031746, titled "Analog-to-Digital Converter and Clock Generation Circuit Thereof", filed with the Chinese National Intellectual Property Administration on Jan. 3, 2019, both of which are incorporated herein by reference in their entity.

TECHNICAL FIELD

The present disclosure relates to the technical field of microelectronics, and in particular to an analog-to-digital converter and a clock generation circuit thereof.

BACKGROUND

Successive approximation analog-to-digital converters (ADCs) occupy a major market share of medium to high-resolution analog-to-digital converters. The successive approximation analog-to-digital converter implements a binary search algorithm. Generally, a N-bit successive approximation analog-to-digital converter requires N+2 or N+3 comparison cycles, and a next conversion cannot be performed before the conversion for the previous bit is completed. Due to the successive approximation algorithm, an actual working clock of the successive approximation ADC is far greater than its sampling rate.

When the successive approximation analog-to-digital converter is used in high-speed applications, it is necessary to provide a high-speed and high-precision clock signal. When the clock speed is over the 100M level, the complexity of clock circuit would have a greater impact on the system and increase power consumption of the system.

SUMMARY OF THE INVENTION

In view of the above, it is necessary to provide an analog-to-digital converter and a clock generation circuit thereof against the problem that a complex clock circuit will affect a working system when a successive approximation analog-to-digital converter is used in high-speed applications.

A clock generation circuit includes cascaded clock generation modules, in which the clock generation module at each stage is configured to generate a corresponding internal clock signal, and the clock generation module at each stage includes a delay module and a logic gate module;

an output terminal of a $N^{th}$-stage delay module is connected to an input terminal of a $(N+1)^{th}$-stage delay module, in which an input terminal of a first-stage delay module is configured to input an external clock signal, and a frequency of the external clock signal is lower than a frequency of the internal clock signal;

each of the logic gate modules includes a first input terminal, a second input terminal and an output terminal, in which the first input terminal of a $N^{th}$-stage logic gate module is connected to the output terminal of the $N^{th}$-stage delay module, the second input terminal of the $N^{th}$-stage gate module is connected to the output terminal of a $(N-1)^{th}$-stage logic gate module, and the output terminal of the $N^{th}$-stage logic gate module is configured to output a $N^{th}$ internal clock signal, where N is larger than or equal to 2; and the first input terminal of a first-stage logic gate module is configured to input the external clock signal, and the second input terminal of the first-stage logic gate is connected to an output terminal of the first-stage delay module.

An analog-to-digital converter includes the clock generation circuit described above.

The clock generation circuit described above can be applied to analog-to-digital converters or other electronics. Since the frequency of the external clock signal is lower than the frequency of the internal clock signal, the external low-frequency clock signal can be converted into an internal high-frequency clock signal. When the user needs to use a high-frequency clock signal, there is no need to generate a high-frequency signal externally, and it is only required to connect a low-frequency clock signal from the outside. After processing by the clock generation circuit of the present application, multiple internal high-frequency clock signals are obtained, which reduces the application difficulty of the electronics and system complexity. The present application uses the logic gate modules and the delay modules in cooperation. Since the second input terminal of the $N^{th}$-stage logic gate module is connected to the output terminal of the logic gate module at the previous stage, whereas the output terminal of the logic gate module is configured to output the internal clock, the clock generation module at each stage can generate an internal clock signal, and the internal clock N can be calculated by the internal clock N−1 and the delay time of the delay module in the clock generation module at the same stage; one external clock signal can be used to generate 2~N two internal clock signals, and the user may choose one of the clocks for the analog-to-digital converter according to requirements. The principle is simple, the circuit structure is simple and easy to implement, the system power consumption is reduced, and the analog-to-digital converter will not be affected after the principle is applied in the analog-to-digital converter.

BRIEF DESCRIPTION OF THE DRAWINGS

In order to better describe and illustrate the embodiments and/or examples of the inventions disclosed herein, reference may be made to one or more drawings. Additional details or examples used to describe the drawings should not be considered as limiting the scope of any of the disclosed inventions, or the currently described embodiments and/or examples, or the currently best modes of these inventions.

DETAILED DESCRIPTION OF THE EMBODIMENT(S) OF THE INVENTION

Figure 1:
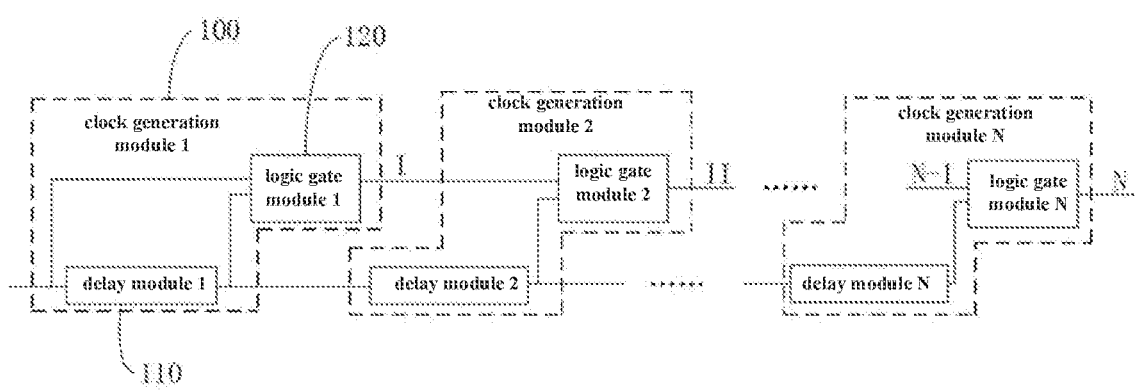
FIG. 1 is a schematic diagram of a clock generation circuit module provided by an embodiment of the present application.

In order that the above objects, features and advantages of the present disclosure can be understood more obviously and easily, specific implementations of the present disclosure will be described in detail below with reference to the accompanying drawings. In the following description, many specific details are explained to enable a sufficient understanding of the present disclosure. However, the present disclosure can be implemented in many other ways different from those described herein, and those skilled in the art can make similar improvements without departing from the spirit of the present disclosure. Therefore, the present disclosure is not limited by the specific embodiments disclosed below.

It should be noted that when an element is referred to as being "provided to" another element, it may be directly located on said other element or there may also be an intervening element. When an element is considered as being "connected to" another element, it may be directly connected to said other element or there may also be an intervening element at the same time. Terms "vertical", "horizontal", "left", "right" and similar expressions used herein are for illustrative purposes only, and do not indicate that they represent the only implementation.

Unless otherwise defined, all technical and scientific terms used herein have the same meaning as commonly understood by those skilled in the technical field of the present disclosure. The terms herein used in the description of the present disclosure are only for the purpose of describing specific embodiments, and are not intended to limit the present disclosure.

As described in the "BACKGROUND", the successive approximation analog-to-digital converter is of a common structure for medium to high resolution applications with a sampling rate lower than 5 Msps. In high-speed applications where the sampling rate is higher than 5 Msps, since the clock is too high, it is difficult for an approximation register of the conventional structure to meet the requirements, and a way of combining it with other structures is usually used to obtain a high-speed successive approximation analog-to-digital converter. Generally, there are the following mainstream practices in the industry: 1. A high-performance phase-locked loop is built in to provide a high-precision clock, but the performance of the phase-locked loop will heavily affect the characteristics of the analog-to-digital converter. In addition, the phase-locked loop will significantly increase chip area and power consumption. 2. A pipelined successive approximation analog-to-digital converter is adopted. The analog-to-digital converter of this structure is composed of multiple stages of analog-to-digital sub-converters combined together, which can significantly improve the conversion speed of the successive approximation register, and also obviously increase the complexity of the circuit. 3. Successive approximation analog-to-digital converters for parallel operation are used, in which multiple analog-to-digital converters work in parallel, different phase clocks are allocated to different registers through auxiliary circuits such as phase-locked loops, and multiple registers collect converted data in different phases in sequence, which can greatly increase a conversion rate of the analog-to-digital converters theoretically; however, in practical applications, there are factors such as offset and gain error between the registers of different channels, which will severely restrict the performance of the analog-to-digital converters.

Therefore, referring to FIG. 1, a clock generation circuit according to an embodiment of the present application is provided to address problems as mentioned above. It should be noted that the clock generation circuit provided by this embodiment may be applied not only to successive approximation analog-to-digital converters, but also to other types of analog-to-digital converters and any circuit that requires high-speed clocks. The clock generation circuit includes multiple cascaded clock generation modules 100, in which the clock generation module 100 at each stage is configured to generate an internal clock signal. The clock generation module 100 at each stage includes a delay module 110 and a logic gate module 120.

The delay modules 110 includes multiple stages. As shown in FIG. 1, a first-stage delay module is a delay module 1, a second-stage delay module is a delay module 2, a $N^{th}$-stage delay module is a delay module N, and so on. The delay module 110 at each stage is cascaded to another one, and an output terminal of the delay module N is connected to an input terminal of a delay module N+1. An input terminal of the delay module 1 is configured to input an external clock signal. A clock cycle of the output internal clock signal can be controlled by controlling a delay time of the delay module 110.

The multiple stages of logic gate modules 120 are cascaded with each other, and the logic gate module 120 at each stage is connected to the corresponding delay module 110. In this embodiment, a first-stage logic gate module is a logic gate module 1, a second-stage logic gate module is a logic gate module 2, a $N^{th}$-stage logic gate module is a logic gate module N, and so on. Each of the logic gate modules 120 includes a first input terminal, a second input terminal, and an output terminal. The first input terminal of the logic gate module N is connected to the output terminal of the delay module N, the second input terminal of the logic gate module N is connected to the output terminal of a logic gate module N−1, and the output terminal of the logic gate module N is configured to output a $N^{th}$ internal clock signal, where N is larger than or equal to 2. The first input terminal of the logic gate module 1 is configured to input an external clock signal, and the second input terminal of the logic gate module 1 is connected to the output terminal of the delay module 1. In this embodiment, the frequency of the external clock signal is lower than the frequency of the internal clock signal.

The clock generation circuit provided by the present embodiment can convert the external low frequency clock signal into the internal high-frequency clock signal. When the user needs to use a high-frequency clock signal, it is unnecessary to generate the high-frequency signal externally, but only to connect a low-frequency clock signal from the outside. Then, by processing the low-frequency clock signal via the clock generation circuit of the present application, multiple internal high-frequency clock signals can be obtained. Difficulties in applying electronics and complexity of the system are thus reduced. The clock generation module 100 at each stage in the clock generation circuit can generate one internal clock signal. For example, the first-stage clock generation module is configured to generate an internal clock I, and the second-stage clock generation module is configured to generate an internal clock II, and the $N^{th}$-stage clock generation module is configured to generate an internal clock N. The internal clock N is calculated from an internal clock N−1 and the delay time of the delay module 110 in the clock generation module 100 at the same stage. In this embodiment, by cooperating of the logic gate module 120 and the delay module 110, one external clock signal can be used to generate 2~N internal clock signals. The user may choose one of the clocks for the analog-to-digital converter according to requirements. The principle is simple, the circuit structure is simple and easy to implement, the system power consumption is reduced, and the electronics will not be affected after the principle is applied to the analog-todigital converter or other electronics. The user may also adjust a cycle length of the output clock signal by adjusting the delay time of the delay module, thus making the adjustment convenient.

Figure 2:
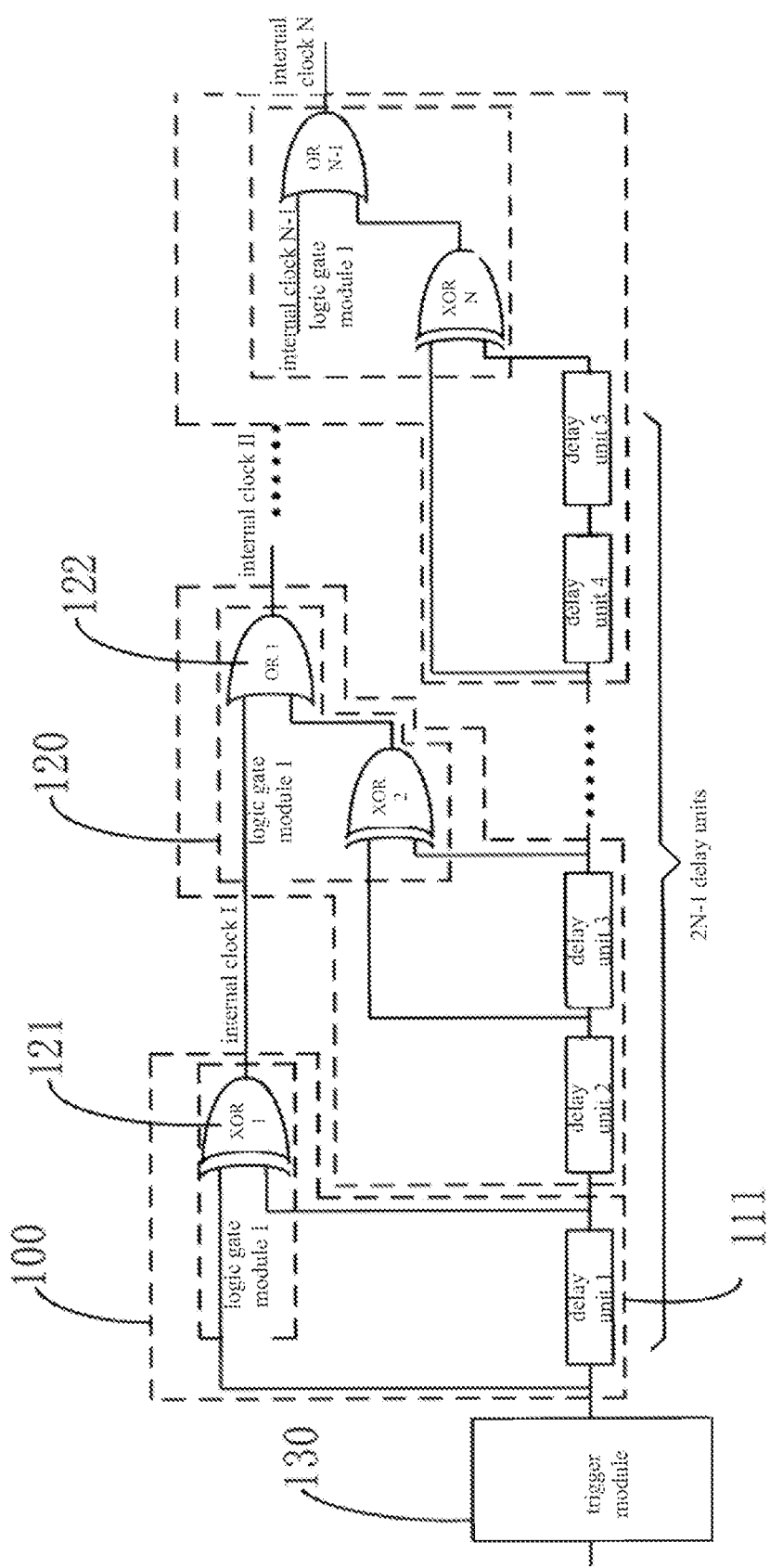
FIG. 2 is a schematic diagram of a clock generation circuit module provided by another embodiment of the present application.

Referring to FIG. 2, in one of the embodiments, the delay module 110 includes multiple delay units 111. An output terminal of the delay unit 111 is connected to an input terminal of the next delay unit 111. The clock generation circuit provided by this embodiment includes 2N−1 delay units. The delay module 1 includes one delay unit 111, and the delay modules from the delay module 2 to the delay module N each include two delay units; that is, the delay module 1 includes a first delay unit, and the delay module N includes a $(2N-2)^{th}$ delay unit and a $(2N-1)^{th}$ delay unit, where N is larger than or equal to 2.

Figure 3:
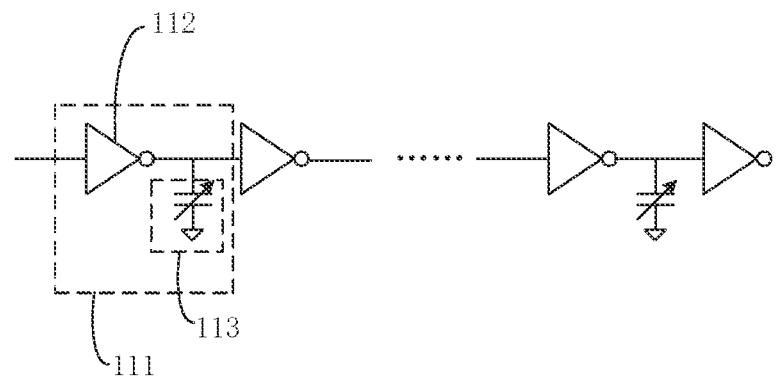
FIG. 3 is a schematic structural diagram of a delay unit provided by embodiment of the present application.

Specifically, in this embodiment, the delay unit 111 is configured to control a clock cycle of the generated internal clock signal. Referring to FIG. 3, each delay unit 111 includes at least one phase inverter 112, and the phase inverters 112 of the multiple delay units 111 are cascaded with each other. By adjusting the number of the phase inverters 112, the user may adjust the delay time of the corresponding delay unit 110.

Furthermore, each delay unit 110 further includes at least one adjustable capacitor 113. One terminal of the adjustable capacitor 113 is connected to an output terminal of the phase inverter 112, and the other terminal of the adjustable capacitor 113 is grounded. By adjusting a capacity of the adjustable capacitor 113, the user may adjust the delay time of the corresponding delay unit 110. In this embodiment, in order to adjust the delay time of the delay unit 110, the user may either adjust the number of the phase inverters 112 separately, or adjust the capacity of the capacitor 113 separately, or adjust the number of the phase inverters 112 and the capacity of the capacitor 113 at the same time. Since a pulse width of the internal clock signal generated by each clock generation module 100 depends on the delay time of the delay unit 110, and the delay time of each delay unit 110 may be adjusted by adjusting the number of phase inverters 112 or the capacity of the adjustable capacitor 113. Accordingly, the pulse width of each stage of the internal clock generated by the clock generation circuit provided by this embodiment can be adjusted. Further, the user may adjust the pulse width of each stage to be the same as required, so as to generate synchronous clocks. Alternatively, the user may adjust the pulse width of each stage to be different as required, so as to generate asynchronous clocks.

Still referring to FIG. 2, the clock generation circuit includes multiple stages of logic gate modules 120, in which a logic gate module 1 includes an exclusive-OR (XOR) gate 121, and logic gate modules from a logic gate module 2 to a logic gate module N each include an exclusive-OR gate 121 and an OR gate 122. Each of the exclusive-OR gates 121 includes a first input terminal, a second input terminal and an output terminal. The first input terminal of a first exclusive-OR gate 121 is connected to the input terminal of the first delay unit 111, the second input terminal is connected to the output terminal of the first delay unit 111, and the output terminal of the first exclusive-OR gate 121 is configured to output a first internal clock signal.

The logic gate module N includes a $N^{th}$ exclusive-OR gate 121 and a $(N-1)^{th}$ OR gate 122, in which an output terminal of the $(N-1)^{th}$ OR gate 122 is the output terminal of the logic module N, and is configured to output the $N^{th}$ internal clock signal.

The first input terminal of the $N^{th}$ exclusive-OR gate 121 is connected to the output terminal of the $(2N-2)^{th}$ delay unit 111, and the second input terminal is connected to the output terminal of the $(2N-1)^{th}$ delay unit 111. A first input terminal of the $(N-1)^{th}$ OR gate 122 is connected to the output terminal of the $N^{th}$ exclusive-OR gate 121, and a second input terminal of the $(N-1)^{th}$ OR gate 122 is connected to the output terminal of the logic module 120 at the previous stage, where N is larger than or equal to 2.

Specifically, the input terminal of the first delay unit 1 is configured to receive an external clock signal. If the external clock signal is a high-level signal, it will be processed by the first delay unit 1 to output a low-level signal. The external clock signal and the obtained low-level signal enter the first exclusive-OR gate 1, and the high level of the internal clock I can be obtained after the operation by the first exclusive-OR gate 1, in which the pulse width of the internal clock I equals to the delay time of the first delay unit 1, whereas the low-level time of the internal height clock I depends on the delay time of a second delay unit 2. After the first delay unit 1 outputs the low-level signal, the low-level signal enters the second delay unit 2 in the second clock generation module, and the second delay unit 2 processes the low-level signal and outputs a high-level signal. The high-level signal is transmitted to the first input terminal of a second exclusive-OR gate 2, and at the same time, the high-level signal is transmitted to a third delay unit 3. The third delay unit 3 processes the high-level signal and outputs a low-level signal to the second input terminal of the second exclusive-OR gate 2. And thus the second exclusive-OR gate 2 outputs a high level. The high level output from the first exclusive-OR gate 1 and the high level output from the second exclusive-OR gate 2 enter the first OR gate 1, and the first OR gate 1 outputs the high-level signal of the internal clock II, a pulse width of which depends on the delay time of the third delay unit 3. The pulse width of the low-level signal of the internal clock II depends on the delay time of a fourth delay unit 4, and the previous clock cycle of the internal clock II is the same as the clock cycle of the internal high-speed clock I.

Figure 4:
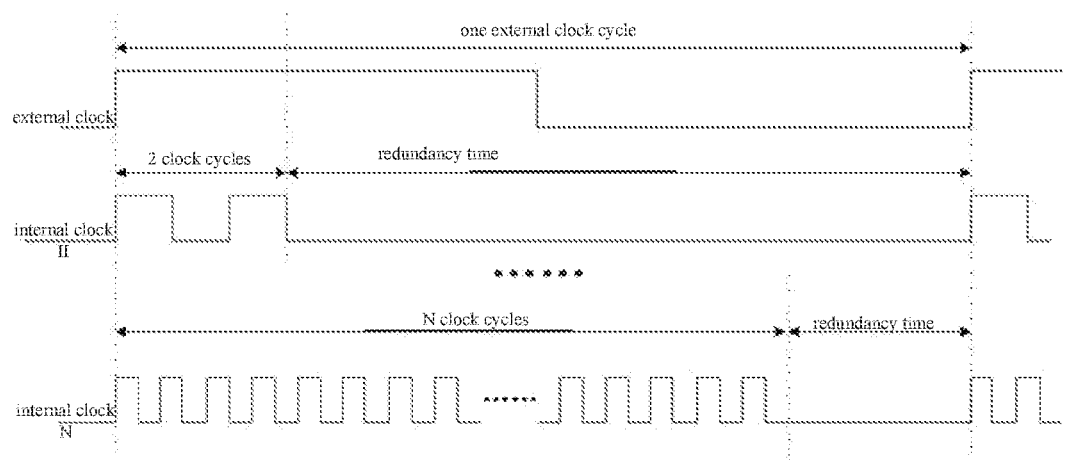
FIG. 4 is a timing diagram generated by a clock generation circuit provided by an embodiment of the present application.

By analogy, the third to the $N^{th}$ internal clocks can be generated. Reference is made to FIG. 4, which is a timing diagram of the internal clocks. The first N−1 clock cycles of the internal clock N are the same as those of the internal clock N−1, and the high-level pulse width of the $N^{th}$ clock of the internal clock N depends on the delay time of the $(2N-1)^{th}$ delay unit. The clock cycles of the internal 2~N clocks plus the respective redundancy time are equal to one external clock cycle.

Since the analog-to-digital converter needs a start signal for sampling and conversion before sampling, in this embodiment, the first high-speed clock signal may also be used as the start signal of the analog-to-digital converter. Therefore, the clock circuit can not only generate internal clock signals, but also can generate a start signal, which simplifies the circuit module of the analog-to-digital converter.

With continued reference to FIG. 2, in one of the embodiments, the clock generation circuit further includes a trigger module 130. An input terminal of the trigger module 130 is configured to input the external clock signal, and output terminals of the trigger module 130 are respectively connected to the input terminal of the first delay unit 1 and the first input terminal of the first exclusive-OR gate 1. In this embodiment, the trigger module may be a T flip-flop, and the T flip-flop may perform frequency division processing on the external clock signal to eliminate undesired falling or rising edges.

An embodiment of the present application provides an analog-to-digital converter including the clock generation circuit described above.

In the analog-to-digital converter provided by the present application, the clock generation circuit thereof uses one external clock signal to generate 2~N internal clock signals through the operations of the logic gate modules and the delay modules. The user may select one of the clocks for the analog-to-digital converter according to requirements. The principle is simple, the circuit structure is simple and easy to implement, the system power consumption is reduced, and the analog-to-digital converter will not be affected.

The technical features of the above embodiments may be combined arbitrarily. In order to make the description concise, not all the possible combinations of the various technical features in the above embodiments are described. However, they should be considered as falling within the scope of this specification, as long as there is no contradiction in the combinations of these technical features.

The above embodiments only show several implementations of the present disclosure, and the descriptions are relatively specific and detailed; however, they should not be therefore interpreted as limiting the scope of the present disclosure. It should be pointed out that for those skilled in the art, several modifications and improvements may also be made without departing from the concept of the present disclosure, and these modifications and improvements will all fall within the scope of protection of the present disclosure. Therefore, the scope of protection of the present disclosure shall be subject to the appended claims.

What is claimed is:

1. A clock generation circuit, comprising cascaded clock generation modules, the clock generation module at each stage being configured to generate a corresponding internal clock signal, and the clock generation module at each stage comprising a delay module and a logic gate module;

an output terminal of a $N^{th}$-stage delay module being connected to an input terminal of a $(N+1)^{th}$-stage delay module, wherein an input terminal of a first-stage delay module is configured to input an external clock signal, and a frequency of the external clock signal is lower than a frequency of the internal clock signal;

each of the logic gate modules comprising a first input terminal, a second input terminal and an output terminal, the first input terminal of a $N^{th}$-stage logic gate module being connected to the output terminal of the $N^{th}$-stage delay module, the second input terminal of the $N^{th}$-stage gate module being connected to the output terminal of a $(N-1)^{th}$-stage logic gate module, and the output terminal of the $N^{th}$-stage logic gate module being configured to output a $N^{th}$ internal clock signal, where N is larger than or equal to 2; and the first input terminal of a first-stage logic gate module being configured to input the external clock signal, and the second input terminal being connected to an output terminal of the first-stage delay module;

wherein each of the delay modules comprises a delay unit, in which, the first-stage delay module includes a first delay unit, the $N^{th}$-stage delay module comprises a $(2N-2)^{th}$ delay unit and a $(2N-1)^{th}$ delay unit, and N is larger than or equal to 2, and an output terminal of each of the delay units is connected to an input terminal of the next delay unit, and an input terminal of the first delay unit is configured to input the external clock signal;

wherein the first-stage logic gate module comprises a first exclusive-OR gate, a first input terminal of the first exclusive-OR gate is connected to the input terminal of the first delay unit, a second input terminal of the first exclusive-OR gate is connected to the output terminal of the first delay unit, and an output terminal of the first exclusive-OR gate is configured to output a first internal clock signal; and wherein the $N^{th}$-stage logic gate module comprises a $N^{th}$ exclusive-OR gate and a $(N-1)^{th}$ OR gate, an output terminal of the $(N-1)^{th}$ OR gate is the output terminal of the $N^{th}$-stage logic module for outputting the $N^{th}$ internal clock signal, and a first input terminal of the $N^{th}$ exclusive-OR gate is connected to the output terminal of the $(2N-2)^{th}$ delay unit, a second input terminal of the $N^{th}$ exclusive-OR gate is connected to the output terminal of the $(2N-1)^{th}$ delay unit, a first input terminal of the $(N-1)^{th}$ OR gate is connected to an output terminal of the $N^{th}$ exclusive-OR gate, and a second input terminal of the $(N-1)^{th}$ OR gate is connected to the output terminal of the logic module at the previous stage, where N is larger than or equal to 2.

2. The clock generation circuit according to claim 1, wherein each of the delay units comprises at least one phase inverter.

3. The clock generation circuit according to claim 2, wherein a delay time of the delay unit is adjusted by setting the number of the phase inverter.

4. The clock generation circuit according to claim 2, wherein the delay unit further comprises at least one adjustable capacitor, one terminal of the adjustable capacitor is connected to an output terminal of the phase inverter, and the other terminal of the adjustable capacitor is grounded.

5. The clock generation circuit according to claim 4, wherein a delay time of the delay unit is adjusted by configuring a capacity of the adjustable capacitor.

6. The clock generation circuit according to claim 5, wherein a high-level pulse width of a $N^{th}$ clock of the internal clock N is equal to the delay time of the $(2N-1)^{th}$ delay unit.

7. The clock generation circuit according to claim 6, wherein clock cycles of the second internal clock to the $N^{th}$ internal clock plus the corresponding redundancy times respectively are equal to one external clock cycle.

8. The clock generation circuit according to claim 5, wherein a pulse width of each stage of the internal clocks is configured to be the same to generate synchronous clocks; or
a pulse width of each stage of the internal clocks is configured to be different to generate asynchronous clocks.

9. The clock generation circuit according to claim 8, wherein the first internal clock signal is also used as a start signal of an analog-to-digital converter with the clock generation circuit.

10. The clock generation circuit according to claim 9, further comprising a trigger module, an input terminal of the trigger module is configured to input the external clock signal, and output terminals of the trigger module are respectively connected to the input terminal of the first delay unit and the first input terminal of the first exclusive-OR gate.

11. The clock generation circuit according to claim 10, wherein the trigger module comprises a T flip-flop.

12. An analog-to-digital converter, comprising a clock generation circuit which comprises:

cascaded clock generation modules, the clock generation module at each stage being configured to generate a corresponding internal clock signal, and the clock generation module at each stage comprising a delay module and a logic gate module;

wherein an output terminal of a $N^{th}$-stage delay module is connected to an input terminal of a $(N+1)^{th}$-stage delay module, wherein an input terminal of a first-stage delay module is configured to input an external clock signal, and a frequency of the external clock signal is lower than a frequency of the internal clock signal;

wherein each of the logic gate modules comprises a first input terminal, a second input terminal and an output terminal, in which the first input terminal of a $N^{th}$-stage logic gate module is connected to the output terminal of the $N^{th}$-stage delay module, the second input terminal of the $N^{th}$-stage gate module is connected to the output terminal of a $(N-1)^{th}$-stage logic gate module, and the output terminal of the $N^{th}$-stage logic gate module is configured to output a $N^{th}$ internal clock signal, where N is larger than or equal to 2; and wherein the first input terminal of a first-stage logic gate module is configured to input the external clock signal, and the second input terminal is connected to an output terminal of the first-stage delay module;

wherein each of the delay modules comprises a delay unit, in which, the first-stage delay module includes a first delay unit, the $N^{th}$-stage delay module comprises a $(2N-2)^{th}$ delay unit and a $(2N-1)^{th}$ delay unit, and N is larger than or equal to 2, and an output terminal of each of the delay units is connected to an input terminal of the next delay unit, and an input terminal of the first delay unit is configured to input the external clock signal;

wherein the first-stage logic gate module comprises a first exclusive-OR gate, a first input terminal of the first exclusive-OR gate is connected to the input terminal of the first delay unit, a second input terminal of the first exclusive-OR gate is connected to the output terminal of the first delay unit, and an output terminal of the first exclusive-OR gate is configured to output a first internal clock signal; and wherein the $N^{th}$-stage logic gate module comprises a $N^{th}$ exclusive-OR gate and a $(N-1)^{th}$ OR gate, an output terminal of the $(N-1)^{th}$ OR gate is the output terminal of the $N^{th}$-stage logic module for outputting the $N^{th}$ internal clock signal, and a first input terminal of the $N^{th}$ exclusive-OR gate is connected to the output terminal of the $(2N-2)^{th}$ delay unit, a second input terminal of the $N^{th}$ exclusive-OR gate is connected to the output terminal of the $(2N-1)^{th}$ delay unit, a first input terminal of the $(N-1)^{th}$ OR gate is connected to an output terminal of the $N^{th}$ exclusive-OR gate, and a second input terminal of the $(N-1)^{th}$ OR gate is connected to the output terminal of the logic module at the previous stage, where N is larger than or equal to 2.

* * * * *